United States Patent [19]
Tanizawa

[11] Patent Number: 5,216,302
[45] Date of Patent: Jun. 1, 1993

[54] REFERENCE DELAY GENERATOR AND ELECTRONIC DEVICE USING THE SAME

[75] Inventor: Tetsu Tanizawa, Kawasaki, Japan

[73] Assignee: Fujitsu Limited, Kawasaki, Japan

[21] Appl. No.: 761,458

[22] Filed: Sep. 18, 1991

[30] Foreign Application Priority Data

Sep. 18, 1990 [JP] Japan .................................. 2-247937

[51] Int. Cl.[5] .......................... H03K 5/13; H03K 5/159
[52] U.S. Cl. .................................... 307/603; 307/606; 307/608; 307/262; 328/55; 328/155; 331/1 A
[58] Field of Search .................. 328/55, 155; 307/262, 307/601–605, 608; 331/1 A

[56] References Cited

U.S. PATENT DOCUMENTS

| | | | |
|---|---|---|---|
| 4,489,342 | 12/1984 | Gollinger et al. | 307/605 |
| 4,899,071 | 2/1990 | Morales | 307/602 |
| 4,912,433 | 3/1990 | Motegi et al. | 331/8 |
| 4,922,141 | 5/1990 | Lofgren et al. | 307/602 |
| 4,958,120 | 9/1990 | Gopinathan et al. | 328/155 |
| 5,054,038 | 10/1991 | Hedberg | 328/155 |
| 5,059,838 | 10/1991 | Motegi et al. | 307/603 |

FOREIGN PATENT DOCUMENTS 2604836 4/1988 France .
2635239 2/1990 France .

OTHER PUBLICATIONS

Patent Abstracts of Japan, vol. 7, No. 119 (E-177) May 24, 1983 and JP-A-58 039123 (Nippon Denki KK) Mar. 7, 1983.
Patent Abstracts of Japan, vol. 8, No. 181 (E-261) Aug. 21, 1984 and JP-A-59 072814 (Sanyo Denki KK) Apr. 24, 1984.

*Primary Examiner*—Timothy P. Callahan
*Attorney, Agent, or Firm*—Staas & Halsey

[57] ABSTRACT

A reference delay generator includes a delay unit having a plurality of delay elements which are cascaded and respectively have variable delay times. The delay unit receives a reference signal and generates a delayed signal which is a delayed version of the reference signal. A control part detects a phase difference between the reference signal and the delayed signal and generates a control signal which sets the phase difference to an integer multiple of 90°. The control signal is applied to the delay elements, so that the delay times of the delay elements are changed on the basis of the control signal. The control signal is used for, for example, controlling a delay circuit which includes a plurality of delay elements identical to those of the delay unit.

27 Claims, 18 Drawing Sheets

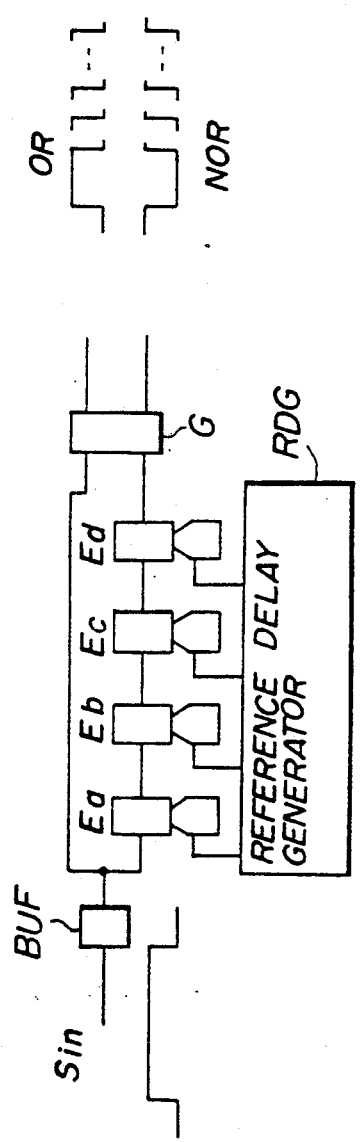

REFERENCE DELAY GENERATOR AND ELECTRONIC DEVICE USING THE SAME

BACKGROUND OF THE INVENTION

(1) Field of the Invention

The present invention generally relates to delay circuits, and more particularly to a voltage (or current) controlled delay circuit capable of generating a delayed signal having an adjustable delay time based on a phase difference between a reference signal and the delayed signal.

(2) Description of the Prior Art

Of the physical quantities which can be handled by semiconductor devices, a voltage generated by a band gap reference circuit and a frequency oscillated by a crystal oscillator circuit are stable physical quantities. The band gap reference circuit and the crystal oscillator circuit are designed to remove temperature dependence and voltage dependence of semiconductor elements. The voltage and frequency generated by these circuits are widely used for various applications. Recently, there has been considerable activity in the development of signal generators using crystal oscillator circuits. Particularly, a signal generator which utilizes the crystal oscillator circuit and a PLL (Phase Locked Loop) circuit has been advanced. Such a signal generator is capable of generating arbitrary frequencies or stabilizing a circuit having low stability by locking it with the precision of the crystal oscillator circuit.

The combination of the crystal oscillator circuit and the PLL circuit can define a stable operation timing. This stable operation timing is used for example, for a shift register. The shift register shifts data in synchronism with a predetermined timing corresponding to a rise or fall of a shift clock. When the shift clock is stabilized, the shift register delays the data precisely.

It should be noted that the stable timing defined by the combination of the crystal oscillator circuit is synchronized with a clock signal generated by the crystal oscillator circuit. Thus, it is impossible to operate the shift register in asynchronism (i.e., asynchronously) with the clock signal generated by the crystal oscillator circuit.

SUMMARY OF THE INVENTION

It is an object of the present invention to provide a reference delay generator which makes it for a delay circuit to generate a delayed signal asynchronized with a highly stable and highly precise reference signal generated by, for example, a crystal oscillator circuit.

The above object of the present invention is achieved by a reference delay generator comprising:

a delay unit having a plurality of delay elements which are cascaded and respectively have variable delay times, the delay unit receiving a reference signal and generating a delayed signal; and control means, coupled to the delay unit, for detecting a phase difference between the reference signal and the delayed signal and for generating a control signal which sets the phase difference to an integer multiple of 90°, the control signal being applied to the delay elements, so that the delay times of the delay elements are changed on the basis of the control signal.

The above-mentioned objects of the present invention are also achieved by a reference delay generator comprising:

a first delay unit having a plurality of delay elements which are cascaded and respectively have variable delay times, the first delay unit receiving a reference signal and generating a first delayed signal;

a second delay unit having a plurality of delay elements which are cascaded and respectively have variable delay times, the second delay unit receiving the reference signal and generating a second delayed signal, the delay elements of the second delay unit being grouped into a first group and a second group;

first control means, coupled to the first delay unit, for detecting a first phase difference between the reference signal and the first delayed signal and for generating a first control signal which sets the first phase difference to an integer multiple of 90°, the first control signal being applied to the delay elements of the first delay unit; and second control means, coupled to the second delay unit, for detecting a phase difference between the reference signal and the second delayed signal and for generating a second control signal which sets the second phase difference to an integer multiple of 90., the second control signal being applied to the delay elements of the second group, and the first control signal being applied to the delay elements of the first group.

The above-mentioned control signal or signals can be applied to various electronic devices, as will be described in detail later.

BRIEF DESCRIPTION OF THE DRAWINGS

Other objects, features and advantages of the present invention will become more apparent from the following detailed description when read in conjunction with the accompanying drawings, in which:

FIG. 11A is a block diagram of a first application of the present invention;

FIG. 11B is a waveform diagram showing the operation of the structure shown in FIG. 11A;

DESCRIPTION OF THE PREFERRED EMBODIMENTS

Figure 1:
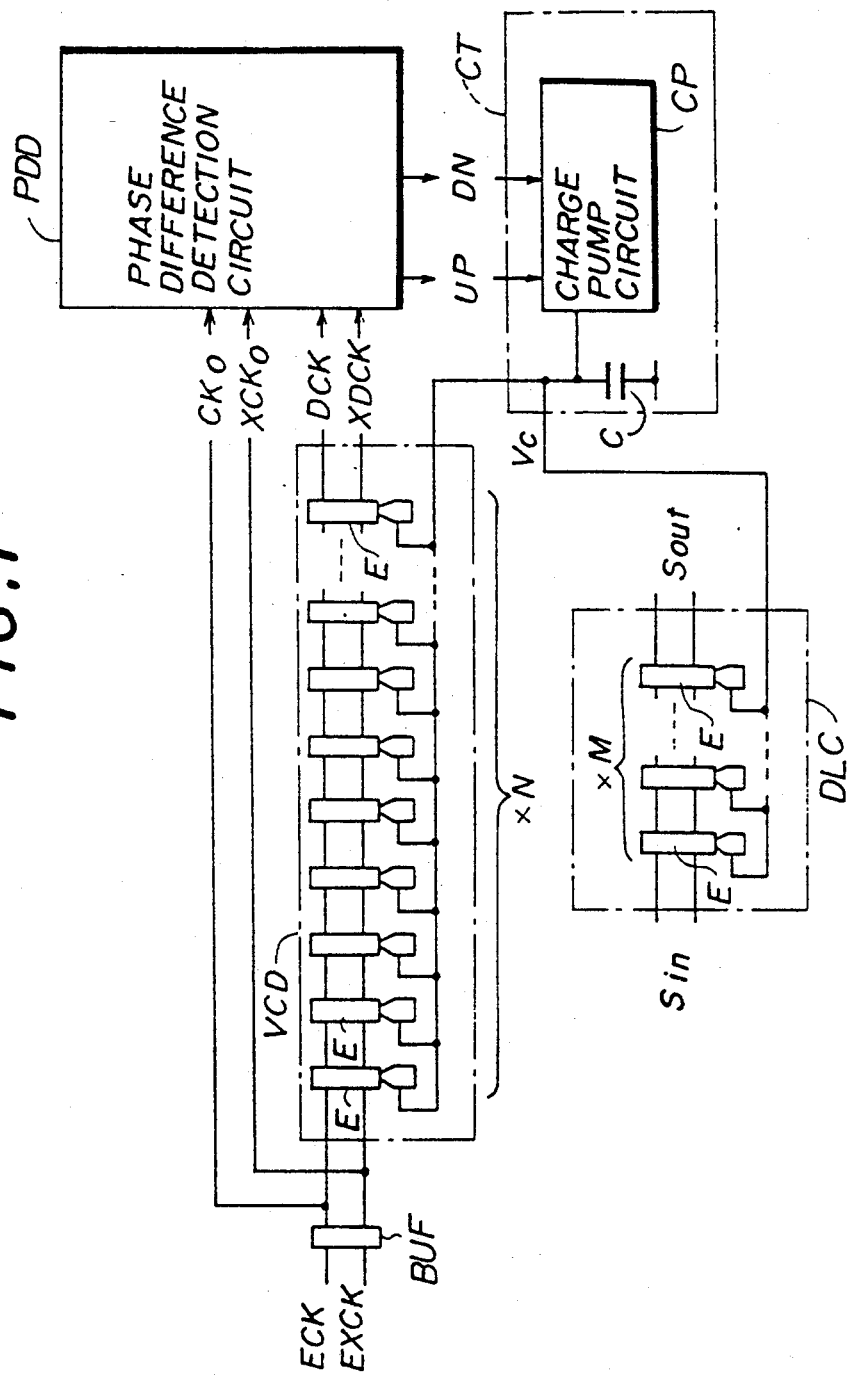
FIG. 1 is a block diagram of a first preferred embodiment of the present invention.

FIG. 1 is a block diagram of a delay circuit according to a first preferred embodiment of the present invention. The delay circuit shown in FIG. 1 comprises a buffer BUF, a voltage-controlled delay unit VCD, a phase difference detection circuit PDD, a control circuit CT, and a delay circuit DLC. The control circuit CT is composed of a charge pump circuit CP and a capacitor C. A reference delay generator for controlling the delay circuit DLC comprises of the voltage-controlled delay unit VCD, the phase difference detection circuit PDD and the control circuit CT.

Complementary external clock signals ECK and EXCK generated by a crystal oscillator circuit or the like are input to the delay unit VCD and the phase difference detection circuit PDD via the buffer BUF. The complementary external clock signals ECK and EXCK have a high stability and a high precision. The voltage-controlled delay unit, VCD delays the complementary clock signals CK0 and XCK0 from the buffer BUF, and outputs delayed complementary signals DCK and XDCK to the phase difference detection circuit PDD, which also receives complementary clock signals CK0 and XCK0 from the buffer BUF. The phase difference detection circuit PDD generates a first detection signal UP and a second detection signal DN on the basis of the phase difference between the clock signals CK0 and DCK and the phase difference between the clock signals XCK0 and XDCK. The charge pump circuit CP charges or discharges the capacitor C on the basis of the first and second detection signals UP and DN. When the delayed clock signal DCK (XDCK) precedes the clock signal CK0 (XCK0), the detection signals UP and DN increase the delay time of the voltage-controlled delay unit VCD. On the other hand, when the delayed clock signal DCK (XDCK) lags behind the clock signal CK0 (XCK0), the detection signals UP and DN decrease the delay time of the voltage-controlled delay unit VCD. A control signal (voltage or current) Vc obtained at one end of the capacitor C is applied to the voltage-controlled delay unit VCD and the delay circuit DLC.

The voltage-controlled delay unit VCD comprises a plurality of N cascaded delay elements E (N is an integer). Each of the N delay elements E is, for example, a voltage-controlled delay element which changes the delay time thereof in accordance with a voltage applied thereto. As shown in FIG. 1, the control voltage Vc is applied to the N delay elements E of the voltage-controlled delay unit VCD. Thus, each of the delay elements E is controlled so that it has an identical delay time.

It will be noted that the voltage-controlled delay unit VCD, the phase difference detection circuit PDD and the charge pump circuit CP and a capacitor C form a PLL circuit. The identical delay times of the N delay elements E are controlled by the control signal Vc so that the delayed clock signals DCK and XDCK lag behind the clock signals CK0 and XCK0 by an integer multiple of 90. For example, the delayed clock signal DCK (XDCK) lags behind the clock signal CK0 (XCK0) by one cycle of the external clock signal ECK. When the clock signals DCK and XDCK lag behind the clock signals DC0 and XCK0 by one cycle, the following equation is obtained:

$$T = \tau N$$

$$\tau = T/N$$

where N is the number of cascaded delay units E of the voltage-controlled delay unit VCD, T is the period (one cycle) of the external clock signal ECK, and $\tau$ is the delay time of each of the delay elements E. Since the period T of the external clock signal ECK generated by, for example, the crystal oscillator, is precisely constant, the delay time $\tau$ is also precisely constant. If the delay elements E of the voltage-controlled delay unit VCD are supplied with a fixed control voltage, the delay time ( will be affected by variations in various parameters, such as the ambient temperature and power supply voltages, characteristic differences among the delay elements E and age deterioration. On the other hand, according to the structure shown in FIG. 1, the voltage Vc is always controlled so that the phase difference between the clock signals CK0 and DCK and the phase difference between the clock signal XCK0 and XDCK are locked at an integer multiple of 90° (for example, one cycle). Thereby, the delay time $\tau$ of each of the delay elements E is automatically controlled, so that the total delay time of the voltage-controlled delay unit VCD is always equal to T (=N$\tau$).

The delay circuit DLC is composed of cascaded M delay elements E (M is an integer). Each of the delay elements E of the delay circuit DLC is the same as that of the voltage-controlled delay unit VCD. The control signal Vc generated by the control circuit CT is applied to each of the delay elements E of the delay circuit DLC. The delay circuit DLC receives complementary input signals Sin and outputs delayed complementary output signals Sout. The delay circuit DLC has a delay time equal to M$\tau$. That is, the output signals Sout lag behind the input signal Sin by M$\tau$. Since the delay time $\tau$ of each of the delay elements E of the delay circuit DLC is regulated by the PLL circuit composed of the VCD, PDD and CT, the delay time of the delay circuit M$\tau$(=M(T/N)) is stabilized. Further, it should be noted that the input signals Sin and output signals Sout may be signals asynchronized with the external complementary clock signals ECK and EXCK. That is, it is possible to adjust the delay time of the delay complementary clock signals from circuit DLC in asynchronism with (i.e., asynchronously with respect to) the external complementary clock signals ECK and EXCK.

For example, when the external clock signal ECK has a frequency of 100 MHz, N=50 and M=1, 2, 3, . . . , the delay time of the delay circuit DLC is 200 ps, 400 ps, 600 ps, . . . .

It should be noted that a plurality of cascaded delay elements are used since the delay times of the delay elements are not exactly the same as each other but each falls within a certain range common to all. By using a plurality of cascaded delay elements, it becomes possible to average (cancel) these delay time deviations.

Figure 2:
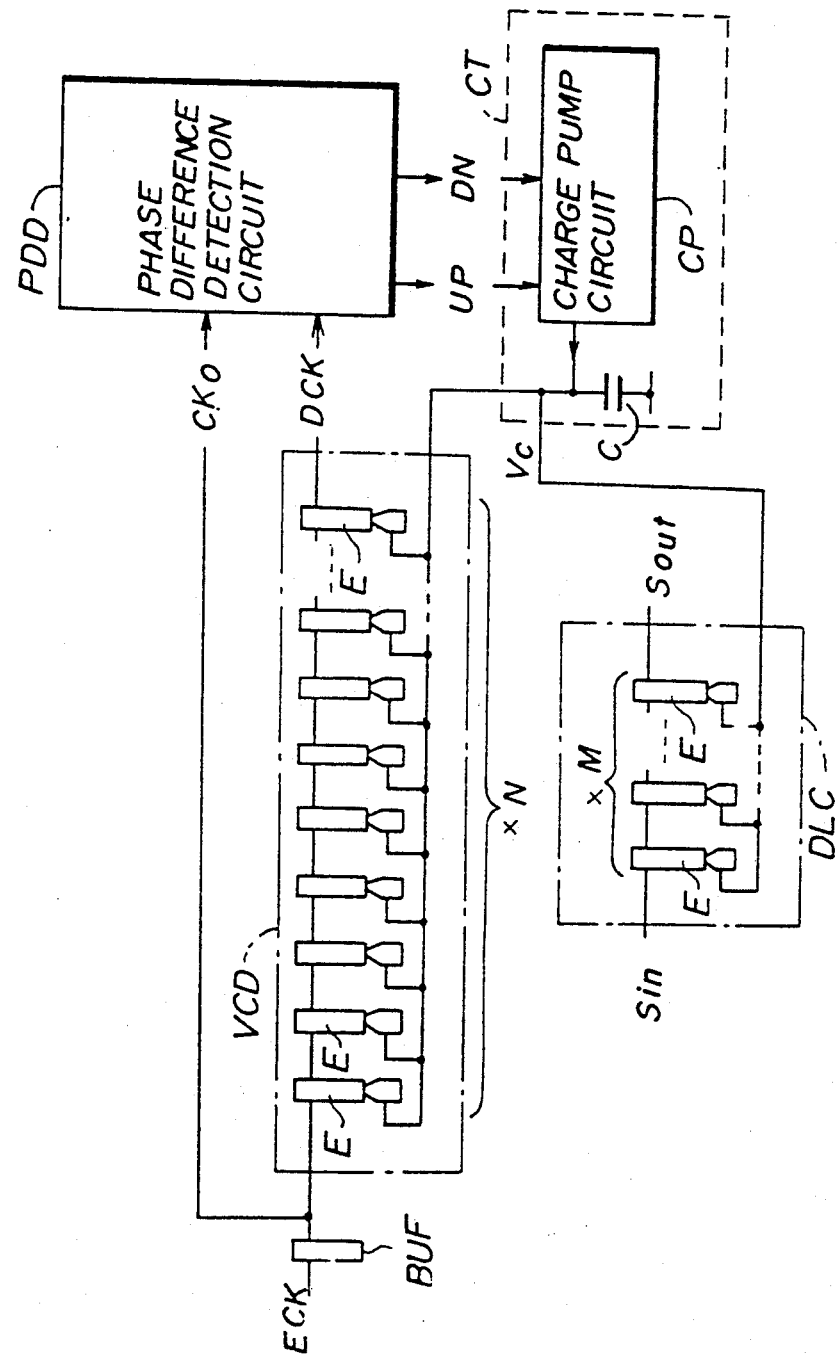
FIG. 2 is a block diagram of a variation of the structure shown in FIG. 1.

FIG. 2 is a block diagram of a variation of the structure shown in FIG. 1. The structure shown in FIG. 2 does not handle the complementary clock signals but a single-end clock signal. That is, the voltage-controlled delay unit VCD delays the external clock signal ECK, and the phase difference detection circuit PDD detects the phase difference between the clock signals CK0 and DCK. Further, the delay circuit DLC delays the input clock signal Sin and outputs the delayed output clock signal Sout.

Figure 3:
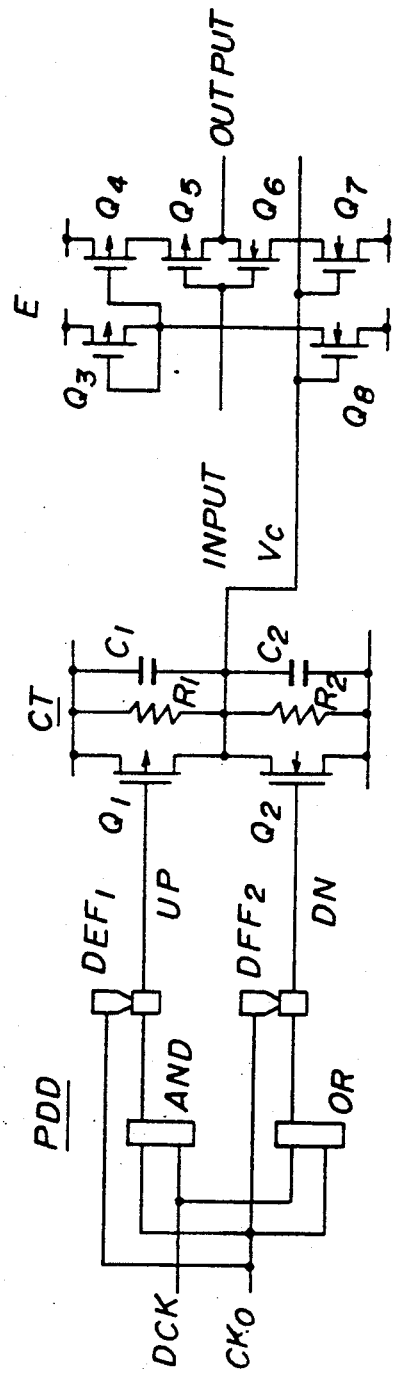
FIG. 3 is a circuit diagram of the structure shown in FIG. 2.

FIG. 3 is a circuit diagram of the phase difference detection circuit PDD, the control circuit CT and one of the delay elements E of the voltage-controlled delay element VCD, all of which are used in the structure shown in FIG. 2. The phase difference detection circuit PDD is composed of an AND gate AND, an OR gate OR, and two D-type flip-flops DFF1 and DFF2. The control circuit CT is composed of a p-channel MOS (Metal Oxide Semiconductor) transistor Q1, an n-channel MOS transistor Q2, two resistors R1 and R2, and two capacitors C1 and C2. The capacitor C shown in FIG. 2 corresponds to the capacitors C1 and C2. The delay element E of the voltage-controlled delay unit VCD is composed of three p-channel MOS transistors Q3, Q4 and Q5, and three n-channel MOS transistors Q5, Q6 and Q7.

Figure 4:
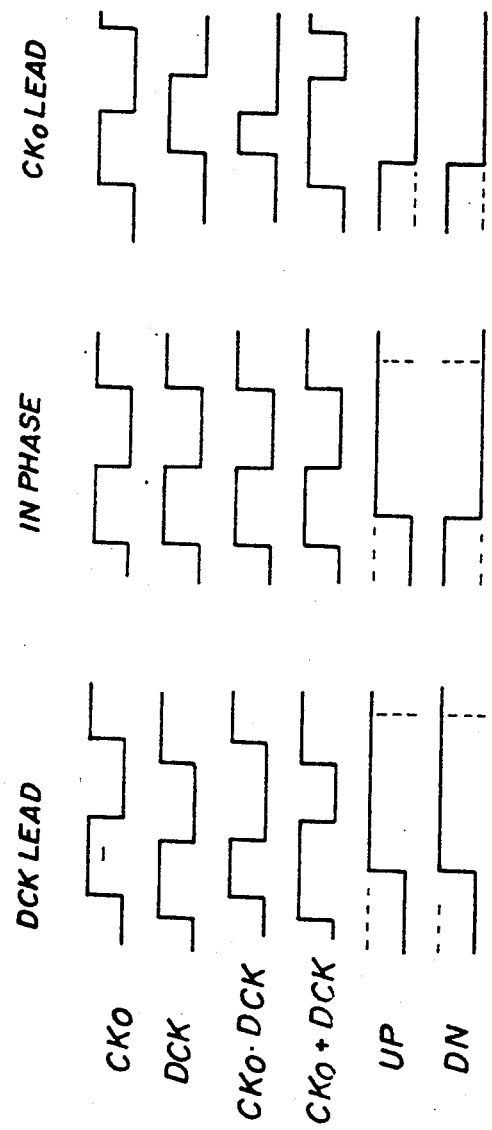
FIGS. 4A, 4B and 4C are waveform diagrams showing the operation of the circuit shown in FIG. 3.

The operation of the circuit shown in FIG. 3 will now be described with reference to FIGS. 4A, 4B and 4C. FIG. 4A shows a case where the phase of the delayed clock signal DCK leads that of the non-delayed clock signal CK0 (that is, the signal CK0 lags behind the signal DCK by a period shorter than one cycle). In this case, the output signal of the AND gate AND (FIG. 3), labeled CK0·DCK, and the output signal of the OR gate (FIG. 3) labeled CK0+DCK, are as shown in FIG. 4A. Thus, both the detection signals UP and DN are at a high level, as shown in FIG. 4A. In this case, the MOS transistors Q1 and Q2 are OFF and ON, respectively. Thus, the capacitor C2 is discharged and the capacitor C1 is charged, so that the control voltage Vc decreases. Since the gate voltages of the MOS transistors Q5 and Q7 decrease, a current passing through the MOS transistors Q3 and Q8 decreases. Since the MOS transistors Q3 and Q4 form a current mirror circuit, a current passing through the MOS transistors Q4–Q7 decreases. Thus, each delay element E has an increased delay time (signal propagation time).

FIG. 4B shows a case where the clock signal DCK is in phase with the clock signal CK0. In this case, the detection signals UP and DN are respectively at the high and low levels, as shown in FIG. 4B. Thus, both the MOS transistors Q1 and Q2 are OFF, and the circuit CT is in the high impedance state, so that the capacitors C1 and C2 are neither discharged or charged. Thus, the control voltage Vc is in the hold state.

FIG. 4C is a case where the phase of the clock signal CK0 leads that of the delayed clock signal DCK. In this case, both the detection signals UP and DN are at the low level, and thus the MOS transistors Q1 and Q2 are ON and OFF, respectively. Thus, the capacitor C1 is discharged and the capacitor C2 is charged, so that the control voltage Vc increases. In response to this increase in the control voltage Vc, the current passing through the MOS transistors Q3 and Q8 increases, and the current passing through the MOS transistors Q4–Q7 also increases. As a result, the delay element E has a decreased delay time.

Figure 5:
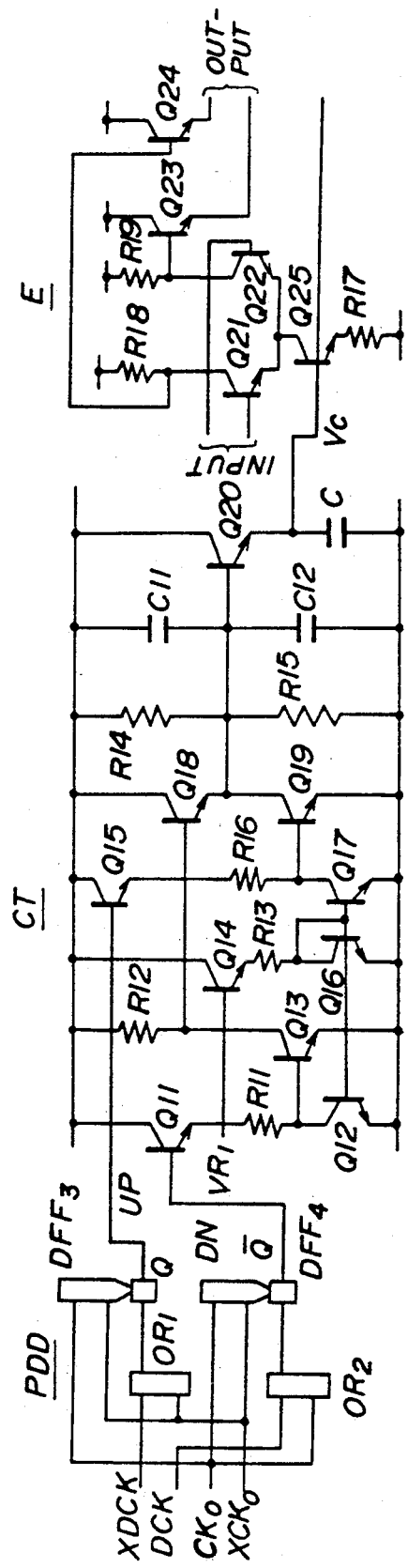
FIG. 5 is a circuit diagram of the structure shown in FIG. 1.

FIG. 5 is a circuit diagram of the structure shown in FIG. 1. As shown, the phase difference detection circuit PDD is composed of two OR gates OR1 and OR2, and two D-type flip-flops DFF3 and DFF4. The control circuit CT is composed of bipolar transistors Q11–Q20, resistors R11–R16 and capacitors C11 and C12. The capacitor C shown in FIG. 1 is connected between the emitter of the transistor Q20 and a low-potential side power supply line. The delay element E of the voltage-controlled delay unit VCD is composed of bipolar transistors Q21–Q25 and resistors R17–R19.

Figure 6:
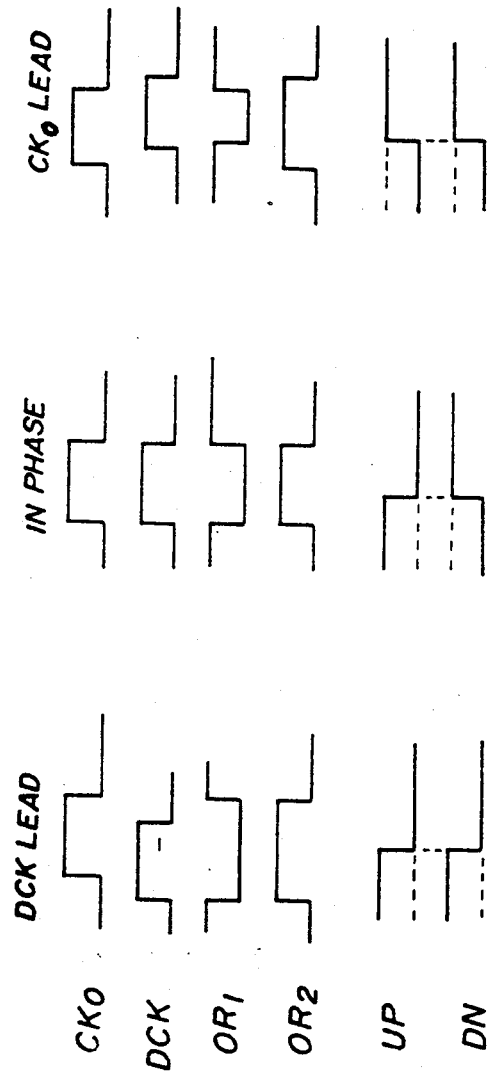
FIGS. 6A, 6B and 6C are waveform diagrams showing the operation of the circuit shown in FIG. 5.

FIGS. 6A, 6B and 6C are waveform diagrams showing the operation of the circuit shown in FIG. 5. Since a reference voltage VR1 is applied to the base of the transistor Q14, the reference current flows through the transistor Q14, the resistor R13 and the transistor Q16. The transistors Q16, Q17 and Q12 form a current mirror circuit. Thus, the same current as the reference current in the transistor Q16 flows through either Q11, R11 and Q12, or Q15, R16 and Q17. As a result, both the detection signals UP and DN are level-shifted and appear at the base nodes of the transistors Q19 and Q13, respectively. The transistor Q13 inverts the shifted signal DN to drive the transistor Q18.

FIG. 6A shows a case where the phase of the delayed clock signal DCK leads that of the non-delayed clock signal CK0. In this case, the output signals of the OR gates OR1 and OR2 are as shown in FIG. 6A. Thus, both the detection signals UP and DN have the low level. In this case, the transistor Q18 is ON, and the transistor Q19 is OFF. Thus, the transistor Q20 is getting more conductive, and thus the capacitor C is charged. As a result, the control voltage Vc increases. Thus, the collector current of the transistor Q25 increases. As a result, the delay element E has a decreased delay time.

FIG. 6B is a case where the delayed clock signal DCK is in phase with the non-delayed clock signal CK0. In this case, as shown in FIG. 6B, the detection signals UP and DN have the low and high levels, respectively. Thus, the transistor Q13 is ON. At this time, the transistor Q18 and Q19 are OFF. Thus, the base node of the transistors Q20 is in the high impedance state, so that the control voltage Vc is held.

FIG. 6C shows a case where the phase of the non-delayed clock signal CK0 leads that of the delayed clock signal DCK. In this case, both the detection signals UP and DN are at the high level, as shown in FIG. 6C. At this time, the transistors Q18 is OFF and the transistor Q19 is ON. Thus, the transistor Q20 is OFF, and the capacitor C is discharged, so that the control voltage Vc decreases. Thus, the delay element has an increased delay time.

Figure 7:
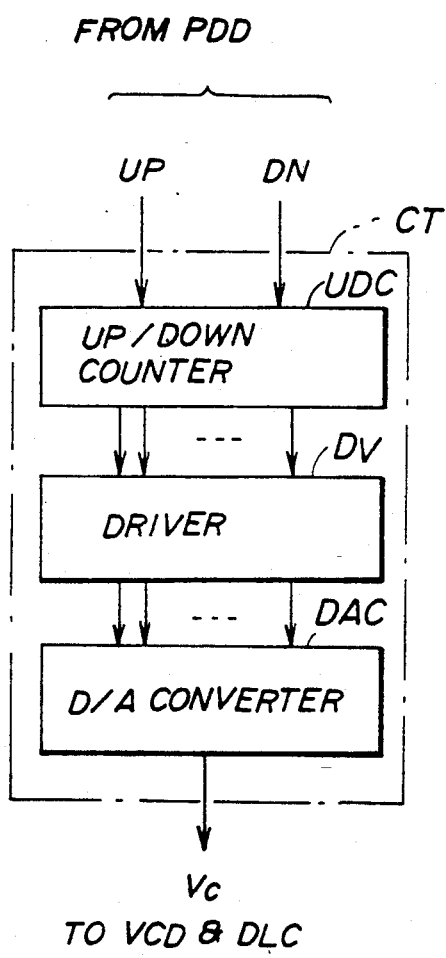
FIG. 7 is a block diagram of a variation of a control circuit shown in FIG. 1 or FIG. 2.

FIG. 7 is a block diagram of a variation of the control circuit CT shown in the previously described figures. The control circuit shown in FIG. 7 is composed of an up/down counter UDC, a driver DV and a digital-to-analog converter DAC. The up/down counter UDC has three modes based on the combinations of the detection signals UP and DN. The first mode is an up count mode, the second mode is a down count mode, and the third mode is a rest mode. The up/down counter UDC outputs a digital numeral which corresponds to the analog control voltage Vc generated by the aforementioned capacitor C. Then, the digital numeral is input to the D/A converter DAC via the driver DV, which functions as a buffer. The digital converter DAC converts the received digital numeral into the analog control voltage Vc, which is applied to the voltage-controlled delay unit VCD and the delay circuit DLC. It is also possible to use a PLL circuit having another structure.

Figure 8:
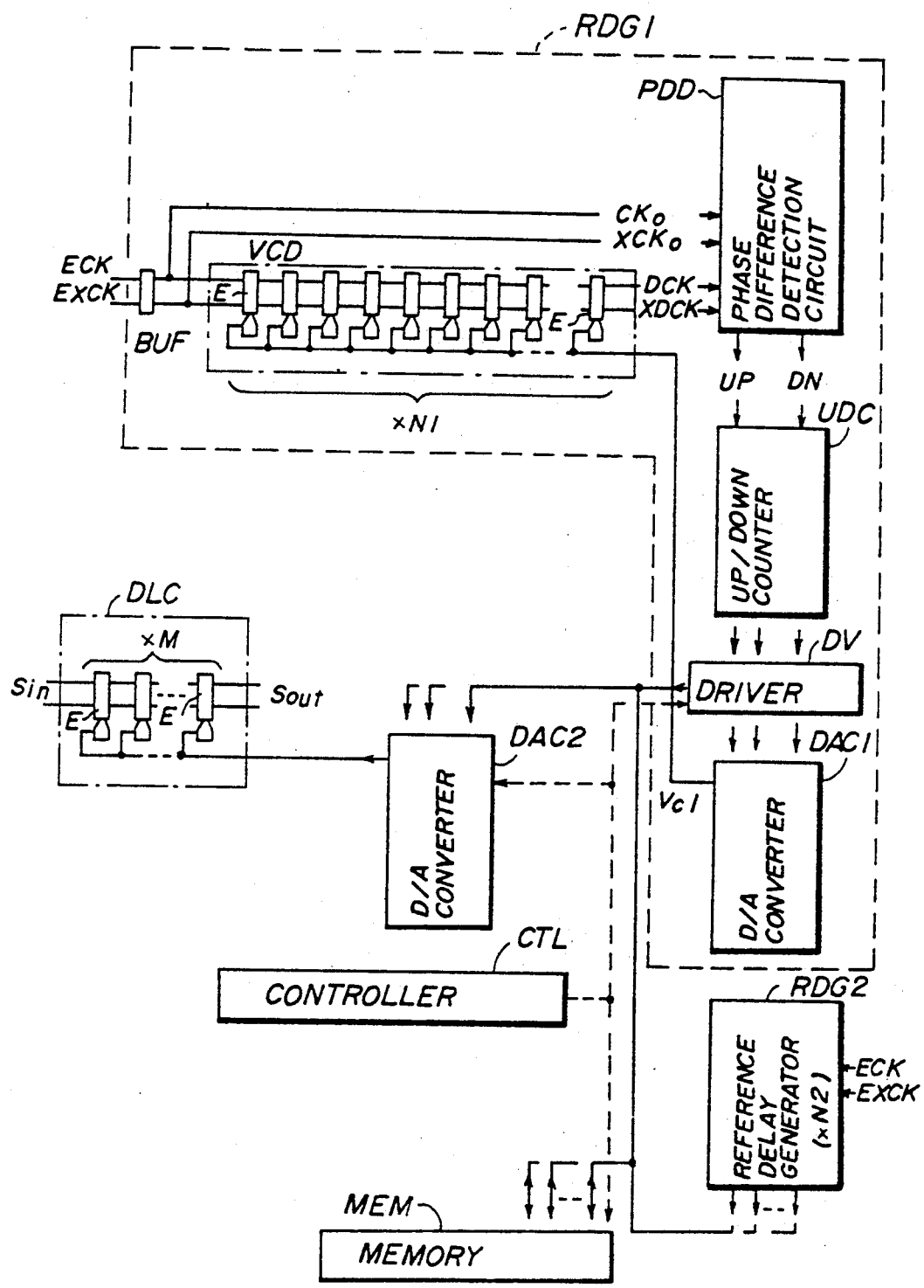
FIG. 8 is a block diagram of a second preferred embodiment of the present invention.

FIG. 8 is a block diagram of a second preferred embodiment of the present invention, which is composed of a first reference delay generator RDG1, a second reference delay generator RDG2, a D/A converter DAC2, a controller CTL, a memory MEM, and the aforementioned delay circuit DLC. The delay circuit DLC is controlled by either the reference delay generator RDG1 or the RDG2. The first reference delay generator RDG1 is configured in the same way as the reference delay generator shown in FIG. 1. More specifically, the first reference delay generator RDG1 is composed of the voltage-controlled delay unit VCD, the phase difference detection circuit PDD, the up/down counter UDC, the driver DV and the D/A converter, labeled DAC1 in FIG. 8. The voltage-controlled delay unit VCD has N1 delay elements E. The D/A converter DAC1 generates a control voltage Vc1.

The second reference delay generator RDG2 is configured in the same way as the first reference delay generator RDG1. The voltage-controlled delay unit VCD (not shown for the sake of simplicity) of the second reference delay generator RDG2 has N2 delay elements E, and the D/A converter thereof (not shown) generates a control voltage Vc2.

The count numeral output by the up/down counter UDC of the first reference delay generator RDG1 is input to the D/A converter DAC2 via the driver DV. Similarly, the count numeral output by the up/down counter (not shown) of the second reference delay generator RDG2 is output to the D/A converter DAC2 via the driver thereof (not shown). The controller CTL controls a bus which mutually connects the drivers of the reference delay generators RDG1 and RDG2 and the memory MEM, and selects one of the count numerals from the first reference delay generator RDG1, one of the count numerals from the second reference delay generator RDG2, and a count numeral in the memory MEM. The D/A converter DAC2 converts the selected count numeral into an analog control signal (voltage), which is applied to each of the M delay elements EDLC.

Each of the delay elements E in the first reference delay generator RDG1 is controlled so that it has a delay time $\tau 1$, and each of the delay elements E in the second reference delay generator RDG2 is controlled so that it has a delay time $\tau 2$. When the controller CTL selects the reference delay generator RDG1, the delay circuit DLC has a delay time of M$\tau 1$. Meanwhile, when the controller CTL selects the reference delay generator RDG2, the delay circuit DLC has a delay time of M$\tau 2$.

It is possible to store the digital count numerals from the reference delay generators RDG1 and RDG2 in the memory MEM under the bus control of the controller CTL. It is also possible to write a digital numeral generated by an external device into the memory MEM under the control of the controller CTL.

The digitized control circuit CT as shown in FIG. 7 or FIG. 8 is superior to the analog control circuit CT shown in FIG. 1 or FIG. 2. A signal line between the control circuit CT and the voltage-controlled delay unit VCD and a signal line between the control circuit CT and the delay circuit DLC respectively have a parasitic capacitance in order to prevent an unnecessary variation in the control voltage Vc. Thus, it is somewhat difficult to rapidly change the control voltage Vc. Meanwhile, use of the digitized control circuit CT does not have the above-mentioned problem.

Figure 9:
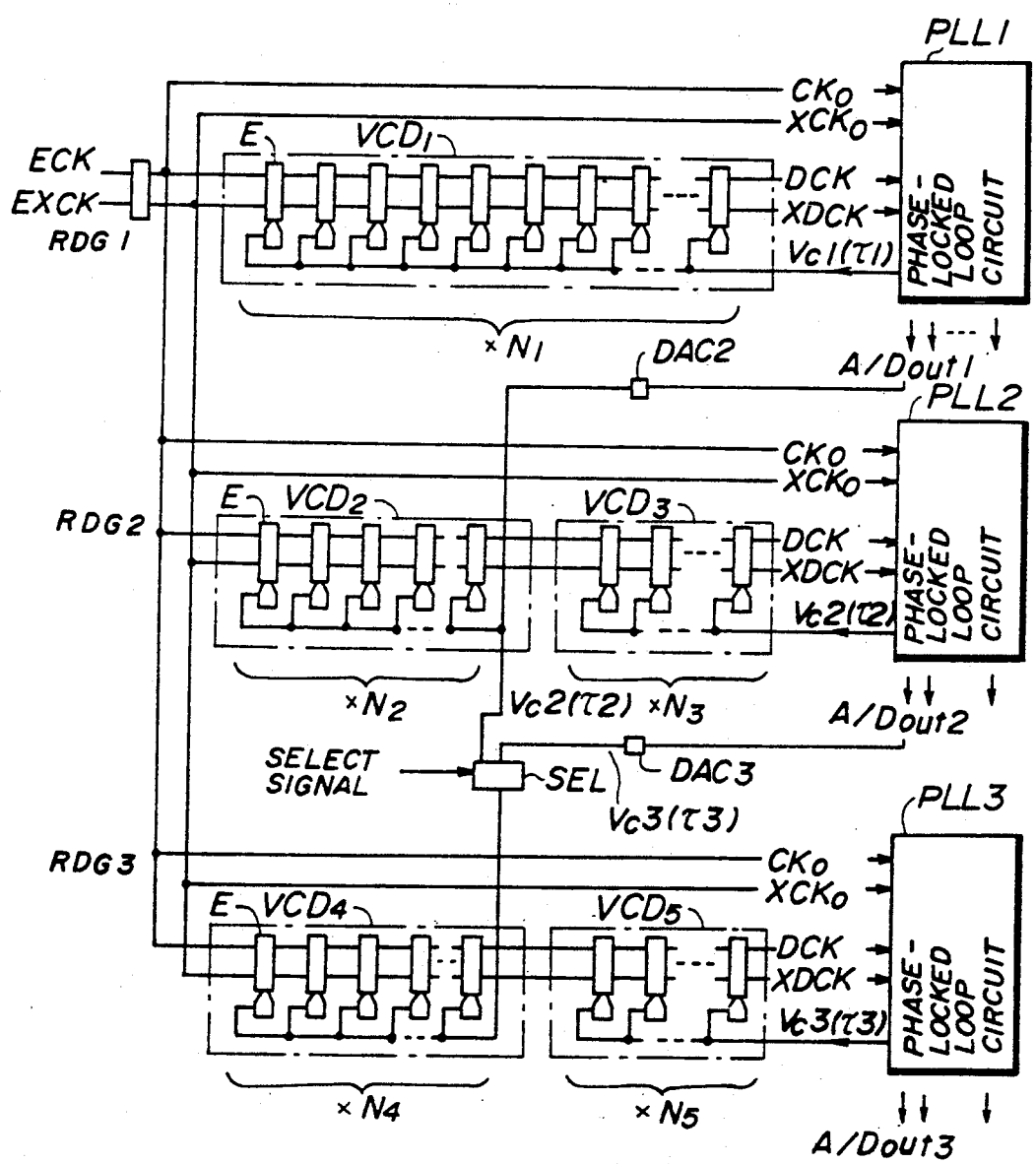
FIG. 9 is a block diagram of a structure which generates a plurality of different control signals.

FIG. 9 is a block diagram of a structure which generates three different control signals (voltages) generated by three reference delay generators RDG1, RDG2 and RDG3. More specifically, the structure shown in FIG. 9 is composed of five voltage-controlled delay units VCD1-VCD5, three phase-locked loop circuits PLL1-PLL3, two D/A converters DAC2 and DAC3, and a selector SEL. Each of the loop-circuit PLL1-PLL3 is made up of a phase difference detection circuit PDD, an up/down counter UDC, a driver DV and a D/A converter DAC. The voltage-controlled delay units VCD2 and VCD3, which are related to the phase-locked loop circuit PLL2, are cascaded. Similarly, the voltage-controlled delay units VCD4 and VCD5, which are related to the phase-locked loop circuit PLL3, are cascaded. As shown in FIG. 9, the voltage-controlled delay units VCD1, VCD2, VCD3, VCD4 and VCD5 have N1, N2, N3, N4 and N5 delay elements, respectively.

The external complementary clock signals ECK and EXCK are input to each of the voltage-controlled delay units VCD1, VCD2 and VCD4. The phase-locked loop circuit PLL1 receives the delayed clock signals DCK and XDCK from the voltage-controlled delay unit VCD1. The phase-locked loop circuit PLL2 receives delayed clock signals DCK and XDCK from the voltage-controlled delay unit VCD3. The phase-locked loop circuit PLL3 receives delayed clock signals DCK and XDCK from the voltage-controlled delay unit VCD5.

The phase-locked loop circuit PLL1 outputs, to the voltage-controlled delay unit VCD1, the control voltage Vc1 which defines the delay time $\tau 1$ of each delay element E, and outputs a digital count numeral A/Dout1 to the D/A converter DAC2. The phase-locked loop circuit PLL2 outputs, to the voltage-controlled delay unit VCD3, a control voltage Vc2 which defines the delay time $\tau 2$ of each delay element E, and outputs a digital count numeral A/Dout2 to the D/A converter DAC3. The phase-locked loop circuit PLL3 outputs to the voltage-controlled delay unit VCD5 a control voltage Vc3 which defines a delay time $\tau 3$ of each delay element E. Further, the phase-locked loop circuit PLL3 generates a digital count numeral A/Dout3, which is not used in the structure shown in FIG. 9. The selector SEL selects either the control signal Vc2 from the D/A converter DAC2 or the control signal Vc3 from the D/A converter DAC3 in accordance with a select signal supplied from an external circuit, such as the controller CTL shown in FIG. 8.

It is possible to omit the D/A converters DAC2 and DAC3. In this case, the analog control signals Vc1 and Vc2 are directly applied to the selector SEL.

The voltage-controlled delay unit VCD1 has a delay time equal to N1$\tau 1$, and a delay unit comprising the voltage-controlled delay units VCD2 and VCD3 has a delay time equal to N2$\tau 1$+N3$\tau 2$. Further, a delay unit comprising of the voltage-controlled delay units VCD4 and VCD5 has a delay time equal to N4$\tau 2$+N5$\tau 3$ when the selector SEL selects the D/A converter DAC3.

When N1=20 and the frequency of the external clock signal ECK (EXCK) is 500 MHz, $\tau 1$=100 ps. When N2=9 and N3=10, 9×100+10$\tau 2$=2000, and thus $\tau 2$=110 ps. When N4=N5=10 and the delay time $\tau 2$ is selected, 10×110+100 $\tau 3$=2000, and thus $\tau 3$=99 ps.

Figure 10A:
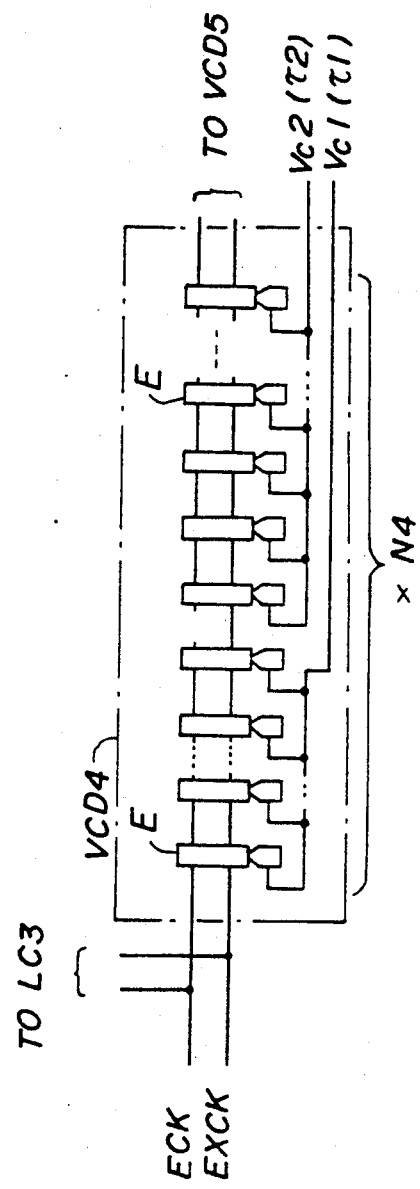
FIGS. 10A and 10B are respectively block diagrams of variations of the structure shown in FIG. 9.

It is also possible to modify the voltage-controlled delay unit VCD4 of FIG. 9 as shown in FIG. 10A. The delay elements E of the voltage-controlled delay unit VCD4 are grouped into two groups, one of which is supplied with the control voltage Vc1 from the D/A converter DAC2, and the other of which is supplied with the control voltage Vc2 from the D/A converter DAC3. When N4=N5=10, various delay times $\tau 3$ are obtained as follows.

τ3=99 ps for N4=9×100 ps+1×110 ps

τ3=98 ps for N4=8×100 ps+2×110 ps

τ3=97 ps for N4=7×100 ps+3×110 ps

τ3=96 ps for N4=6×100 ps+4×110 ps

τ3=95 ps for N4=5×100 ps+5×110 ps

τ3=94 ps for N4=4×100 ps+6×110 ps

τ3=93 ps for N4=3×100 ps+7×110 ps

τ3=92 ps for N4=2×100 ps+8×110 ps

τ3=91 ps for N4=1×100 ps+9×110 ps

τ3=90 ps for N4=0×100 ps+10×110 ps

When τ3=99, the total delay time of τ1, τ2 and τ3 is equal to 309 ps. When τ3=91, the total delay time of τ1, τ2 and τ3 is equal to to 301 ps. The total delay time can be used for controlling the circuit DLC. In this way, it is possible to obtain highly precise delay times. It is possible to use the control voltages Vc1, Vc2 and Vc3 in order to control asynchronous delay circuits.

Figure 10B:
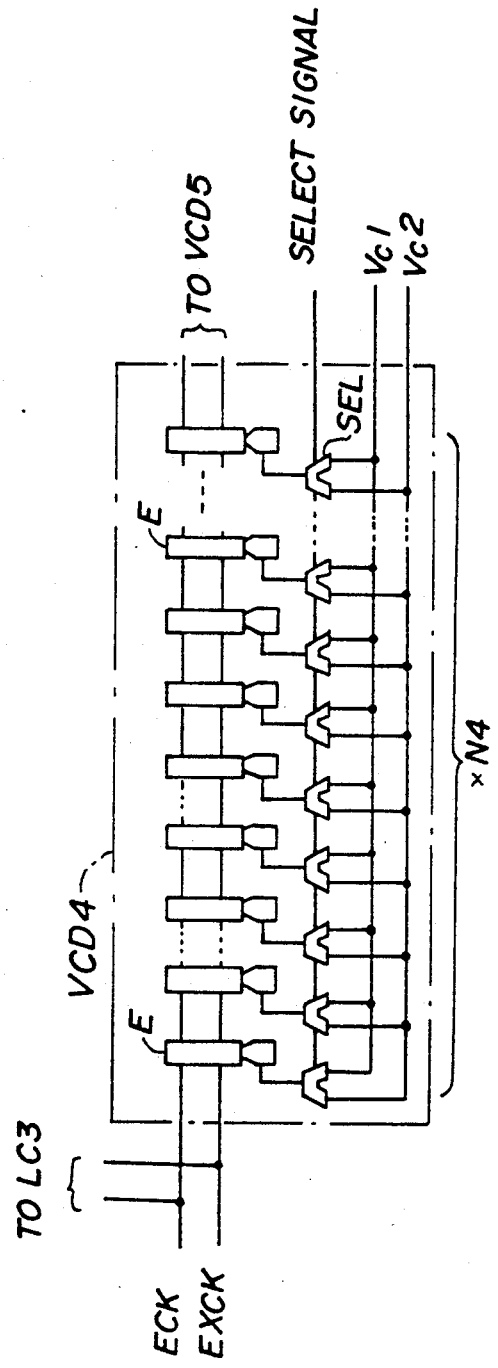

It is also possible to configure the voltage-controlled delay unit VCD4, as shown in FIG. 10B. Selectors SEL are respectively provided for the delay elements E. Each of the selectors SEL selects either the control signal Vc1 or the control signal Vc2 in accordance with a select signal consisting of a plurality of bits, which includes data about the address of the selectors SEL and data indicating which one of the control voltages should be selected. The select signal may be generated by a controller as shown in FIG. 8.

FIG. 11A is a block diagram of a first application of the present invention. The first application shown in FIG. 11A functions as a programmable pulse edge adjustment circuit. As shown, the pulse edge adjustment circuit is composed of a buffer BUF, four delay elements Ea, Eb, Ec and Ed, a gate circuit G and a reference delay generator RDG formed in the same way as described above. It is possible to apply an identical control signal generated by the reference delay generator RDG to each of the delay elements Ea-Ed, which are the same as each other. In this case, each of delay elements Ea-Ed has an identical delay time. The reference delay generator RDG may receive a signal asynchronized with an input signal Si. It is also possible to apply mutually different control voltages generated by the reference delay generator RDG to the delay elements Ea-Ed, in which the reference delay generator RDG includes four reference delay generators. In this case, the delay elements Ea-Ed have delay times τ1-τ4, respectively. The total delay time of the delay elements Ea-Ed corresponds to the sum of the delay times τ1-τ4, i.e., Στi. When the gate circuit G is an OR gate, the fall (i.e., falling, or trailing) edge of the input signal Si is adjusted based on the total delay time Στi, as shown in FIG. 11B. Meanwhile, when the gate circuit G is a NOR gate, the rise (i.e., rising, or leading) edge the input signal Si is adjusted based on the total delay time Στi, as also shown in FIG. 11B.

Figure 12A:
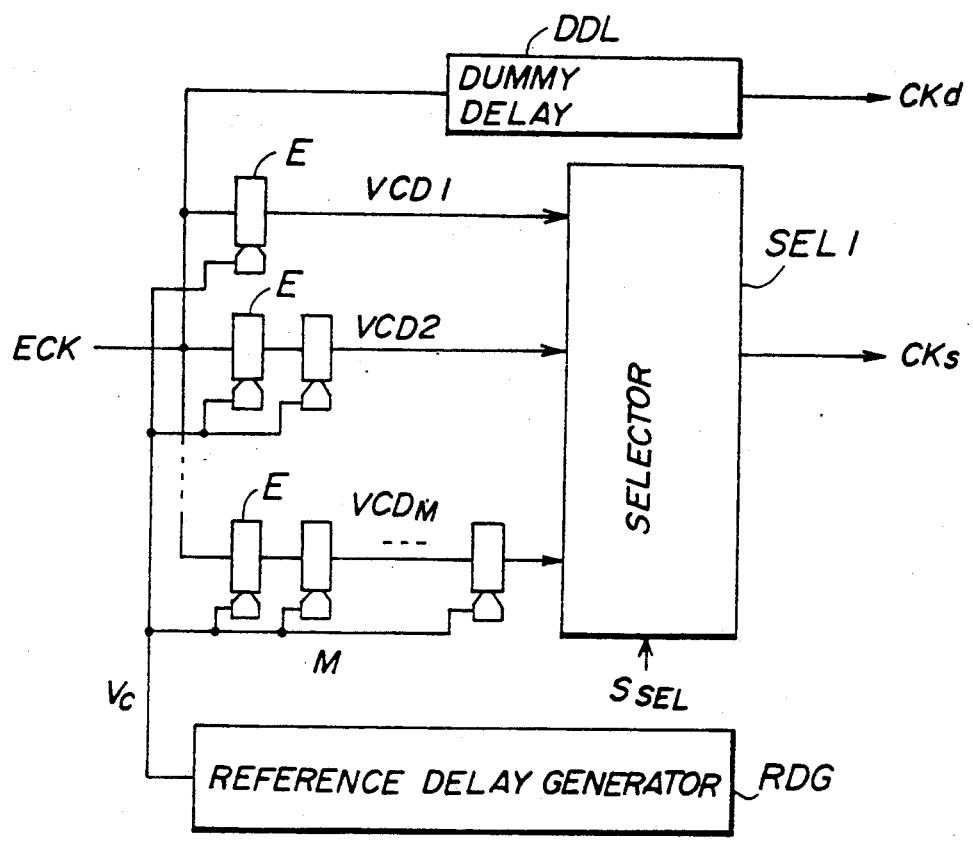
FIGS. 12A and 12B are block diagrams of a second application of the present invention.

FIG. 12A shows a second application of the present invention. A plurality of voltage-controlled delay units VCD1 through VCD$_M$ are provided on a chip. The voltage-controlled delay units VCD1, VCD2 and VCD$_M$, which commonly receive the external clock ECK, respectively comprise one delay element E, two delay elements E and M delay elements E. A reference delay generator RDG, which is formed in the same way as described previously, is provided in common to the voltage-controlled delay units VCD1-VCD$_M$, and outputs the controlled voltage Vc thereto. The reference delay generator RDG may receive a signal asynchronized with the external clock signal ECK. A selector SEL1 selects one of the voltage-controlled delay units VCD1-VCD$_M$ in accordance with a select signal S$_{SEL}$ generated and output by, for example, an external device or the controller as shown in FIG. 8. A selected clock signal CKs output by the SELECTOR SEL1 is applied to internal circuits (not shown in FIG. 12A but see FIG. 12B) on the chip. It should be noted that M highly stable and precise delay clock signals can be generated, from the external clock signal ECK, on the chip. By selectively using the M delayed clock signals, it becomes possible to test the internal circuits on the chip in various ways.

Figure 12B:
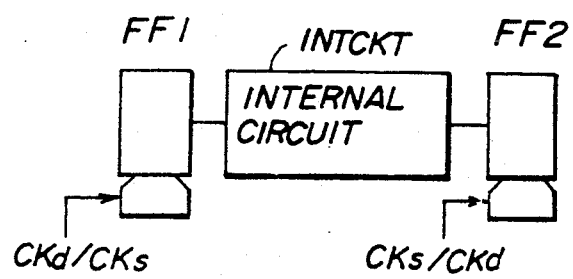

Further, as shown in FIG. 12A, a dummy delay circuit DDL having a delay time equal to that of the selector SEL1 can be provided. The dummy delay circuit DDL generates a delayed clock signal CKd. It is also possible to test the internal circuits by using the delayed clock CKd and the selected clock signal CKs. For example, as shown in FIG. 12B, the delayed clock signal CKd and the selected delayed clock signal CKs are respectively applied to flip-flops FF1 and FF2, which are respectively provided on the input and output sides of an internal circuit INTCKT. Thereby, a setup check can be executed. It is also possible to apply the delayed clock signal CKd and the selected delayed clock signal CKs to the flip-flops FF2 and FF1, respectively. Thereby, a hold check can be executed.

Figure 13:
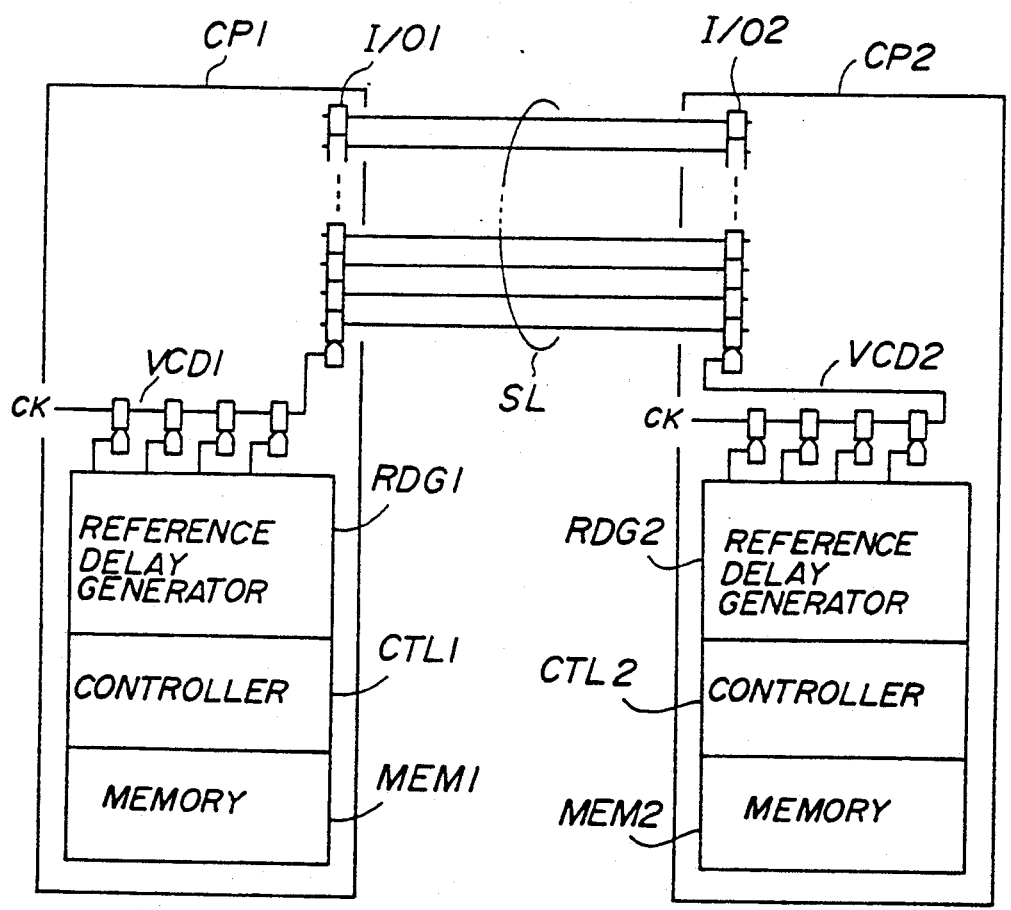
FIG. 13 is a block diagram of a third application of the present invention.

FIG. 13 shows a third application of the present invention which is intended to adjust an input/output timing between two chips CP1 and CP2. As shown in FIG. 13, the chip CP1 includes a voltage-controlled delay unit VCD1, and the chip CP2 includes a voltage-controlled delay unit VCD2. The voltage-controlled delay unit VCD1 is controlled by a reference delay generator RDG1 formed on the chip CP1, and the voltage-controlled delay unit VCD2 is controlled by a reference delay generator RDG2. Each of the reference delay generators RDG1 and RDG2 may receive a signal asynchronized with the clock signal CK. The voltage-controlled delay unit VCD1 receives the clock signal CK and outputs a delayed clock signal to an input/output buffer I/O1, which operates in synchronism with the delayed clock signal CK. Similarly, the voltage-controlled delay unit VCD2 receives the clock signal CK and outputs a delayed clock signal to an input/output buffer I/O2, which operates in synchronism with the delayed clock signal CK. The reference delay generators RDG1 and RDG2 control the voltage-controlled delay units VCD1 and VCD2 so that the delays of the I/O buffers I/O1 and I/O2 and signal lines SL provided therebetween are cancelled. The control voltages obtained at this time can be stored in memories MEM1 and MEM2 under the control of controllers CTL1 and CTL2, respectively. It is also possible to write data about the control voltages, generated by an external device, into the memories MEM1 and MEM2 under the control of the controllers CTL1 and CTL2. It will be noted that the controllers CTL1 and CTL2 and the memories MEM1 and MEM2 correspond to the controller CTL and the memory MEM shown in FIG. 8. The above-mentioned timing adjustment can be performed after the chips CP1 and CP2 are mounted on a board. This means that the I/O timing design is no more needed. The timing adjustment can be executed in the system boot or initializing sequence, and the resultant data will be stored in the memories MEM1 and MEM2.

Figure 14A:
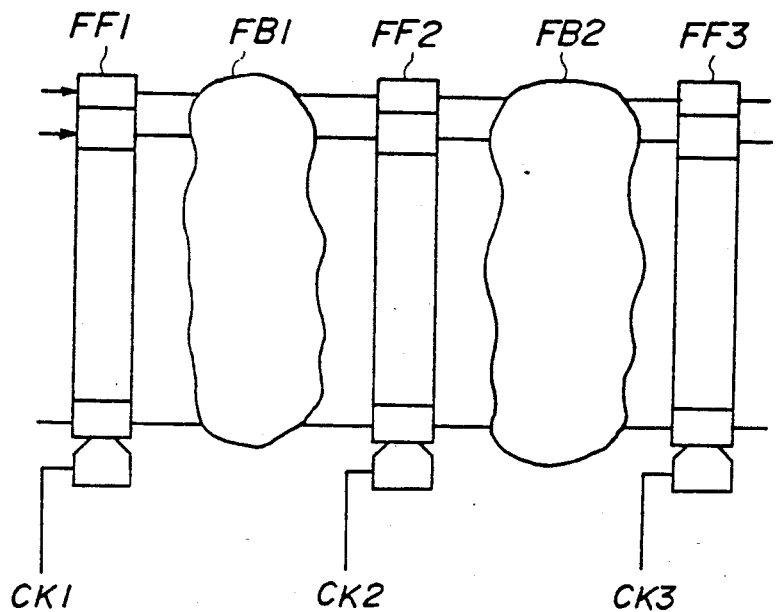
FIGS. 14A, 14B and 14C are block diagrams of a fourth application of the present invention.
Figure 14B:
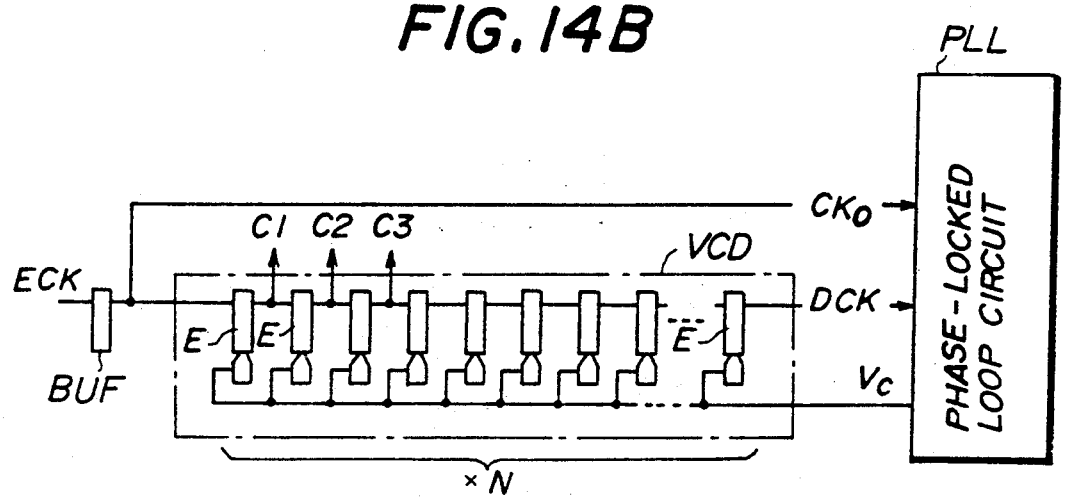
Figure 14C:
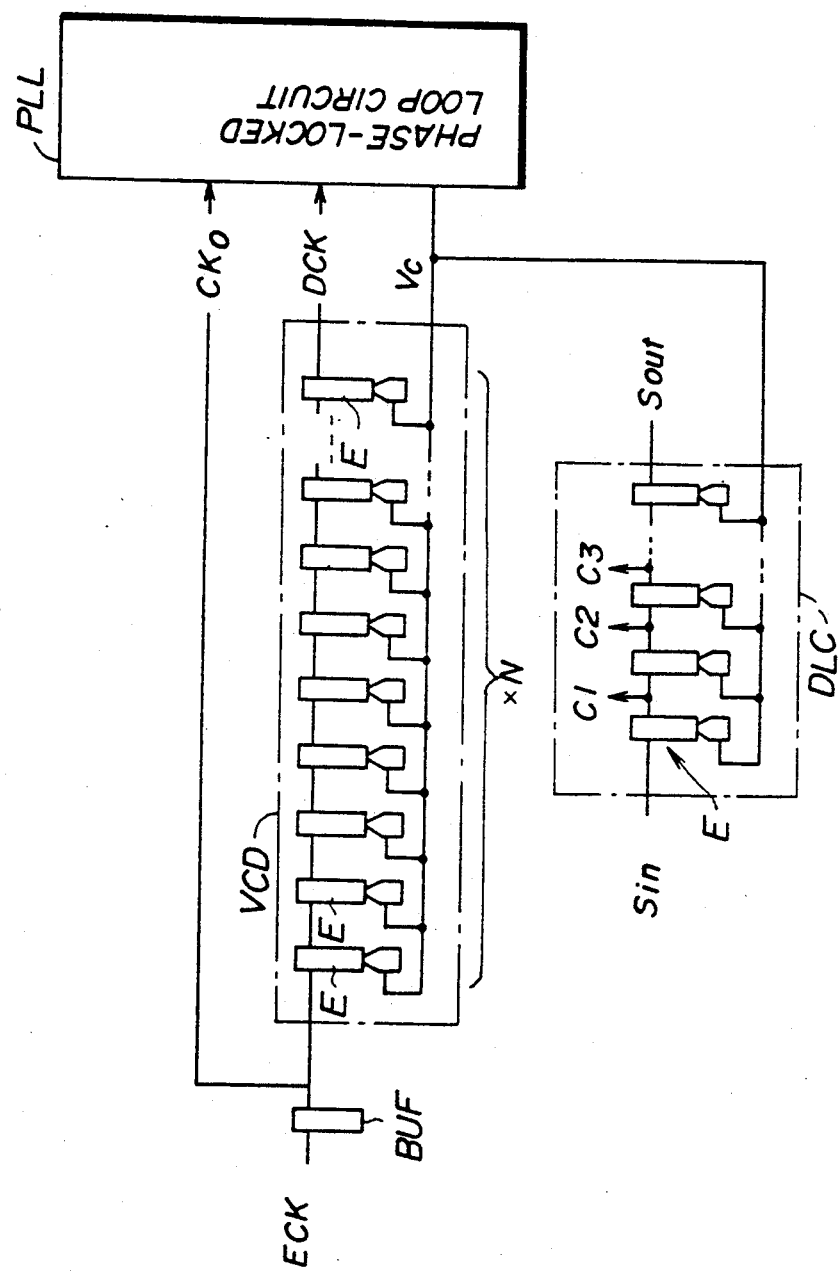

FIGS. 14A, 14B and 14C show a fourth application of the present invention. FIG. 14A shows a pipeline structure composed of function blocks (combination circuits) FB1 and FB2 and three groups of flip-flops FF1, FF2 and FF3. As shown, clock signals CK1, CK2 and CK3 are applied to the groups of flip-flop FF1, FF2 and FF3. Input signals are latched by the flip-flop group FF1 and input to the function block FB1. Output signals of the function block FB1 are latched by the flip-flop group FF2 and input to the function block FB2. Output signals of the function block FB2 are latched by the flip-flop group FF3 and input to a function block (not shown) of the next stage. Conventionally, the same clock signal is respectively applied to the flip-flop groups FF1, FF2 and FF3.

Meanwhile, according to the present invention, it is possible to respectively apply different clock signals to the flip-flop groups. If it is required that the signal receiving timings of some of the flip-flop groups on the input side of the pipeline structure be slightly delayed as compared with the signal receiving timings of the other flip-flop groups then, as shown in FIG. 14B, a delayed intermediate clock signal C3 is applied, as the clock signal CK1, to the flip-flop group FF1, a delayed intermediate clock signal C2 is applied, as the clock signal CK2, to the flip-flop group FF2, and a delayed intermediate clock signal C1 is applied, as the clock signal CK3, to the flip-flop group FF3. The clock signal C1 is also applied to each flip-flop group FF4, FF5, . . . (not shown). Meanwhile, if it is required that the signal receiving timings of some of the flip-flop groups on the input side lead those of the other flip-flop groups, the clock signal C1 is applied, as the clock signal CK1, to the flip-flop group FF1, the clock signal C2 is applied, as the clock signal CK2, to the flip-flop group FF2, and the clock signal C3 is applied, as the clock signal CK3, to the flip-flop group FF3. The clock signal C3 then is also applied to each of the flip-flops FF4, FF5, . . . (not shown).

It is also possible to apply the clock signals C1, C2 and C3 generated by the structure shown in FIG. 14C to the flip-flops FF1, FF2, FF3, . . . in the same way as described above. It will be noted that the input clock signal Sin is asynchronized with the external clock signal ECK.

Figure 15A:
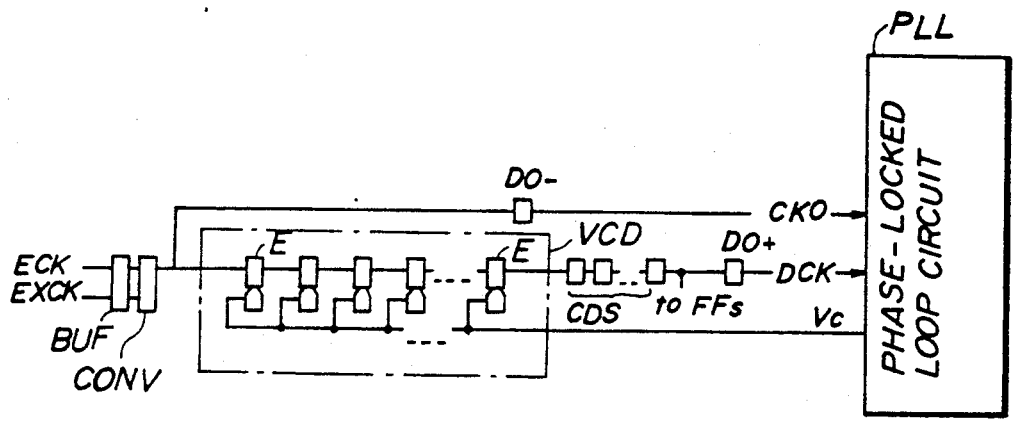
FIGS. 15A and 15B are block diagrams of a fifth application of the present invention.

FIG. 15A shows a fifth application of the present invention, which functions as a clock signal distribution circuit. In FIG. 15A, those parts which are the same as those shown in the previous figures are given the same reference numerals. The CMOS type voltage-controlled delay unit VCD is provided on the input side of a clock distribution system CDS. A signal obtained on the output side of the clock distribution system CDS is input to flip-flops FFs (not shown for the sake of simplicity), and input to the phase-locked loop circuit PLL via a variable delay element D0+. The complementary external clock signals ECK and EXCK are input to a converter CONV via the input buffer BUF. The converter CONV converts the clock signals ECK and EXCK into a CMOS level clock signal, which is applied to the phase-locked loop circuit via a variable delay element D0−. The phase-locked loop circuit PLL compares the phase of the clock signal CK0 with that of the delayed clock signal DCK and generates the control voltage Vc so that the phase difference is equal to a multiple of 90°, (for example, one cycle).

The variable delay elements D0+ and D0− are adjusted as follows. If D0−=0 and D0+ =(the sum of the delay of the input buffer BUF and the delay of the converter CONV), the delay time between the external clock ECK and the clock signal distributed to the flip-flops FFs is almost zero. If D0−=2 ns and D0+ =(the sum of the delay of the input buffer BUT and the delay of the converter CONV), the clock signal distributed to the flip-flops FFs is 2ns behind the external clock signal ECK. In this way, it is possible to distribute a clock signal having a definite phase relationship with the external clock ECK, to the flip-flops FFs.

Figure 15B:
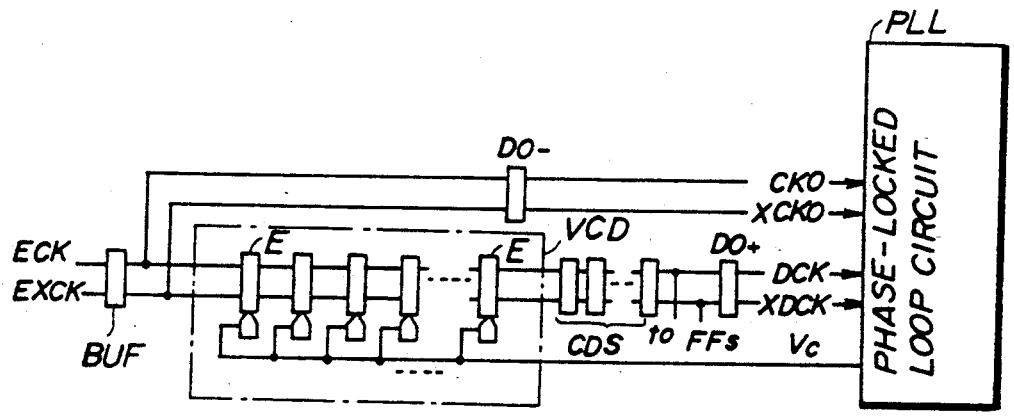

FIG. 15B is a variation of the structure shown in FIG. 15A. The structure shown in FIG. 15B includes the ECL type voltage-controlled delay unit VCD. The structure shown in FIG. 15B operates in the same way as the structure shown in FIG. 15A.

Figure 16:
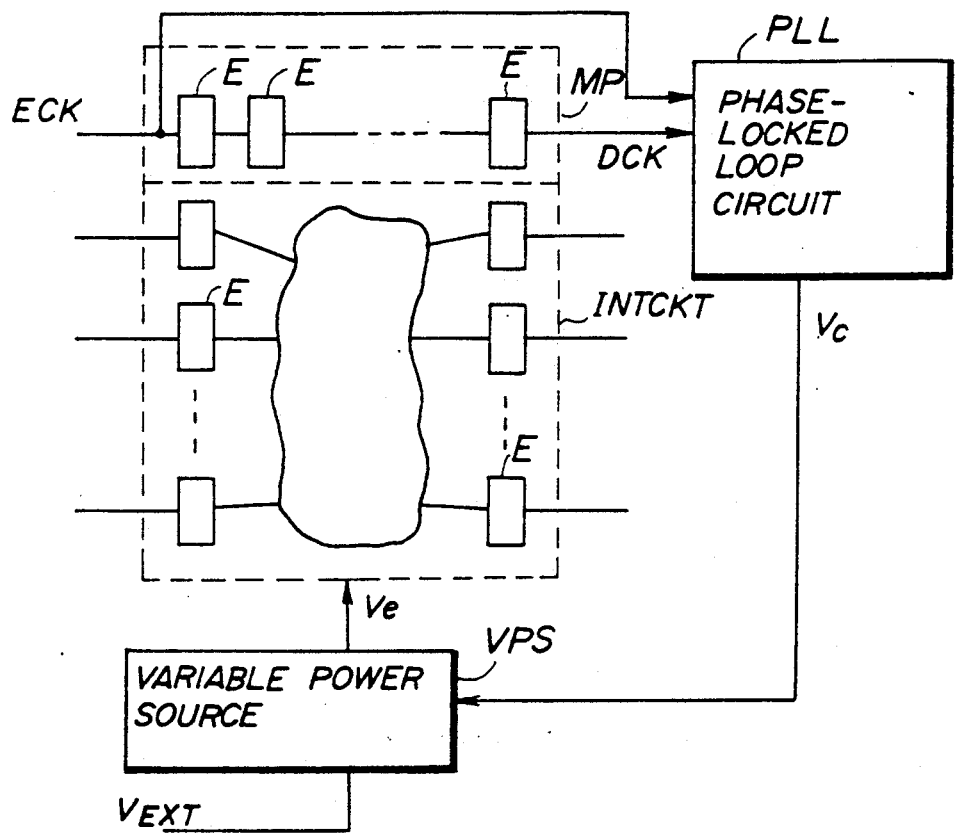
FIG. 16 is a block diagram of a sixth application of the present invention.

FIG. 16 is a block diagram of a sixth application of the present invention, which comprises a monitor path circuit MP and an internal circuit INTCKT. The monitor path circuit MP is formed of a plurality of cascaded internal gates E. The internal circuit INTCKT comprises a plurality of internal gates (delay elements) E of the CMOS, BiCMOS or TTL type. A power supply voltage Ve is generated from an external power supply voltage $V_{EXT}$ by a variable power source VPS, and is applied to each delay element (gate)$^E$ of the monitor path circuit MP and the internal circuit INTCKT. In general, the propagation delay of a gate, such as CMOS, BiCMOS, TTL etc., has a dependency on its supply voltage. Thus, these gates can be used as a voltage-controlled delay unit when their supply voltage is controlled. The phase-locked loop circuit PLL compares the phase of the external clock signal ECK with that of the delayed clock signal DCK and generates the control signal Vc which cancels the phase difference therebetween. The control signal Vc is applied to the variable power source VPS, which adjusts the power supply voltage Ve on the basis of the control signal Vc. Since the power supply voltage Ve applied to the internal gates E of the internal circuit INTCKT is regulated by the control voltage Vc, as generated by the monitor path circuit MP and the phase-locked loop circuit PLL, the delay times of the internal gates E are almost the same as each other.

The present invention is not limited to the specifically disclosed embodiments, and variations and modifications may be made without departing from the scope of the present invention.

What is claimed is:

1. A reference delay generator comprising:
   a delay unit having a plurality of delay elements which are cascaded and respectively have selectively adjustable, variable delay times, said delay unit receiving a reference signal and generating a delayed signal, the reference signal comprising complementary, first and second ECL-level signal components, each of the plurality of delay elements of the delay unit comprising a differential circuit and each such differential circuit receiving the complementary first and second ECL-level signal components of the reference signal; and control means, coupled to said delay unit, for detecting a phase difference between said reference signal and said delayed signal and for generating a control signal which sets the phase difference to an integer multiple of 90°, and said control signal being applied to the delay elements for selectively adjusting the delay times of the delay elements.

2. A reference delay generator as claimed in claim 1, wherein said control means comprises:
phase difference detecting means for detecting the phase difference between the reference signal and the delayed signal and for generating first and second detection signals based on the phase difference;
a capacitor coupled to said delay elements, said control signal being developed across said capacitor; and
charge pump means, coupled to said phase difference detecting means, for charging and discharging said capacitor on the basis of said first and second detection signals.

3. A reference delay generator comprising:
a delay unit having a plurality of cascaded delay elements, the delay elements respectively having selectively adjustable, variable delay times, the delay unit receiving a reference signal and, in response thereto, generating a delayed signal;
control means, coupled to said delay unit, for detecting a phase difference between said reference signal and said delayed signal and for generating said control signal and applying the control signal to the delay elements for selectively adjusting the delay times of the delay elements, for control means comprising:
phase difference detecting means for detecting the phase difference between the reference signal and the delayed signal and for generating first and second detection signals based on the phase difference;
a counter which receives the first and second detection signals and which executes up/down counting operations on the basis of said first and second detection signals and generates a digital count numeral; and
converter means for receiving and converting said digital count numeral into an analog signal corresponding to said control signal.

4. A reference delay generator as claimed in claim 3, wherein said counter comprises an up/down counter.

5. A reference delay generator as claimed in claim 1, wherein said reference signal is a CMOS-level clock signal.

6. A reference delay generator as claimed in claim 1, further comprising:
first delay means, coupled between said delay unit and said control means, for delaying said delayed signal and for outputting, as said delayed signal, a further delayed signal to said control means; and
second delay means for delaying said reference signal and for outputting, as said reference signal, a delayed reference signal to said control means.

7. A reference delay generator as claimed in claim 1, wherein said reference signal is a clock signal.

8. A reference delay generator as claimed in claim 1, further comprising buffer means for receiving said reference signal from an external device and for outputting said reference signal to said delay unit and said control means.

9. A reference delay generator as claimed in claim 3, further comprising:
memory means for storing said digital count numeral output by said counter; and
a controller which reads out said digital count numeral from said memory means and outputs said digital count numeral to the delay elements.

10. A reference delay generator comprising:
a first delay unit having a plurality of delay elements which are cascaded and respectively have variable delay times, said first delay unit receiving a reference signal and generating a first delayed signal;
a second delay unit having a plurality of delay elements which are cascaded and respectively have variable delay times, said second delay unit receiving said reference signal and generating a second delayed signal, said delay elements of said second delay unit being grouped into a first group and a second group;
first control means, coupled to said first delay unit, for detecting a first phase difference between said reference signal and said first delayed signal and for generating a first control signal which sets the first phase difference to an integer multiple of 90°, said first control signal being applied to said delay elements of said first delay unit; and
second control means, coupled to said second delay unit, for detecting a phase difference between said reference signal and said second delayed signal and for generating a second control signal which sets said second phase difference to an integer multiple of 90., said second control signal being applied to the delay elements of said second group, and said first control signal being applied to the delay elements of said first group.

11. A reference delay generator as claimed in claim 10, further comprising:
a third delay unit having a plurality of delay elements which are cascaded and respectively have variable delay times, said third delay unit receiving said reference signal and generating a third delayed signal, said delay elements of said third delay unit being grouped into a first group, a second group and a third group; and
third control means, coupled to said third delay unit, for detecting a third phase difference between said reference signal and said third delayed signal and for generating a third control signal which sets the third phase difference to an integer multiple of 90°, said third control signal being applied to the delay elements of said third group of said third delay unit, said second control signal being applied to the delay elements of said second group of said third delay unit, and said first control signal being applied to the delay elements of said first group of said third delay unit.

12. A reference delay generator as claimed in claim 10, further comprising:
a third delay unit having a plurality of delay elements which are cascaded and respectively have variable delay times, said third delay unit receiving said reference signal and generating a third delayed signal, said delay elements of said third delay unit being grouped into a first group and a second group;
third control means, coupled to said third delay unit, for detecting a third phase difference between said reference signal and said third delayed signal and for generating a third control signal which sets the second phase difference to an integer multiple of 90°; and select means, coupled to said first and second control means, for selectively outputting a predetermined one of said first control signal and said second control signal o the delay elements of said first group of said third delay unit, and said third control signal being applied to the delay elements of said second group of said third delay unit.

13. An electronic device comprising:
a reference delay generator; and
a delay circuit controlled by said reference delay generator, said delay circuit receiving an input signal and generating an output signal which is a delayed version of said input signal, said delay circuit comprising M delay elements which are cascaded and respectively have selectively controllable, variable delay times and wherein M is an integer,
said reference delay generator comprising:
a delay unit having N delay elements which are cascaded and respectively have selectively controllable, variable delay times and wherein N is an integer, said delay unit receiving a reference signal and generating a delayed signal, the reference signal comprising complementary, first and second ECL-level signal components, each of the plurality of delay elements of the delay unit comprising a differential circuit and each such differential circuit receiving the complementary first and second ECL-level signal components of the reference signal; and
control means, coupled to said delay unit and said delay circuit, for detecting a phase difference between said reference signal and said delayed signal and for generating a control signal which sets the phase difference to an integer multiple of 90°, said control signal being applied to the N delay elements of said reference delay generator and the M delay elements of said delay circuit for selectively adjusting the delay times of the delay elements of said reference delay generator and said delay circuit.

14. An electronic device as claimed in claim 13, wherein said input signal applied to said delay circuit is asynchronism with said reference signal.

15. An electronic device as claimed in claim 13, further comprising a logical gate circuit coupled to said delay circuit.

16. An electronic device comprising:
a reference delay generator; and
a delay circuit controlled by said reference delay generator, said delay circuit receiving an input signal and generating an output signal which is a delayed version of said input signal, said delay circuit comprising M delay elements which are cascaded and respectively have variable delay times where M is an integer,
said reference delay generator comprising:
a first delay unit having N1 delay elements which are cascaded and respectively have variable delay times where N1 is an integer, said first delay unit receiving a reference signal and generating a first delayed signal;
a second delay unit having N2 delay elements which are cascaded and respectively have variable delay times where N2 is an integer, said second delay unit receiving said reference signal and generating a second delayed signal;
first control means, coupled to said first delay unit, for detecting a first phase difference between said reference signal and said first delayed signal and for generating a first control signal which sets the second phase difference to an integer multiple of 90°, said first control signal being applied to the N1 delay elements of said first delay unit;
second control means, coupled to said second delay unit, for detecting a phase difference between said reference signal and said second delayed signal and for generating a second control signal which sets said second phase different to an integer multiple of 90., said second control signal being applied to the N2 delay elements of said second delay unit; and
select means, coupled to said first and second control means, for selectively outputting a predetermined one of said first control signal and said second control signal to the M delay elements of said delay circuit.

17. An electronic device as claimed in claim 16, wherein:
said first control signal and said second control signals are respectively digital signals, and
wherein said electronic device further comprises converting means, coupled to said select means, for converting said predetermined one of the first control signal and said second control signal into an analog signal applied to the M delay elements of said delay circuit.

18. An electronic device comprising:
a reference delay generator; and
a pipe line circuit including plural function blocks and plural latch circuits, the function blocks being arranged in succession and cascaded via the latch circuits, each latch circuit receiving a signal from the immediately preceding function block and, after temporarily holding the received signal, outputting the held signal to the next successive function block immediately following the latch circuit
said reference delay generator comprising:
a delay unit having a plurality of cascaded delay elements having selectively adjustable, variable delay times and respectively connected to the latch circuits, said delay unit receiving a reference signal and generating a delayed signal;
control means, coupled to said delay unit and said pipe line circuit, for detecting a phase difference between said reference signal and said delayed signal and for generating a control signal which sets the phase difference to an integer multiple of 90°, said control signal being applied to said delay elements and selectively adjusting the delay times of said delay elements; and
each of said latch circuits operating in synchronism with a delayed intermediate signal obtained at a corresponding one of said delay elements of said delay unit.

19. An electronic device as claimed in claim 18, wherein:
an ith latch circuit among said latch circuits receives the delayed intermediate signal obtained at a jth delay element among said delay elements; and
an (i+1)th latch circuit subsequent to said ith latch circuit receives the delayed intermediate signal obtained at a (j+1)th delay element subsequent to said jth delay element.

20. An electronic device as claimed in claim 18, wherein:
an ith latch circuit among said latch circuits receives the delayed intermediate signal obtained at a jth delay element among said delay elements; and
an (i+1)th latch circuit subsequent to said ith latch circuit receives the delayed intermediate signal obtained at a (j−1)th delay element followed by said jth delay element.

21. An electronic device comprising:
a reference delay generator;
a pipe line circuit including function blocks cascaded via latch circuits, each latch circuit receiving a signal from the immediately preceding function block and, after temporarily holding the received signal, outputting the held signal to the next successive function block immediately following the latch circuit; and
a delay circuit controlled by said reference delay generator, said delay circuit receiving an input signal and generating an output signal which is a delayed version of said input signal, said delay circuit comprising a plurality of delay elements which are cascaded,
a reference delay generator comprising:
a delay unit having a plurality of cascaded delay elements respectively having selectively adjustable, variable delay times and respectively connected to the latch circuits, said delay unit receiving a reference signal and generating a delayed signal;
control means, coupled to said delay unit and said pipe line circuit, for detecting a phase difference between said reference signal and said delayed signal and for generating a control signal which sets the phase difference to an integer multiple of 90°, said control signal being applied to the delay elements of said reference delay generator and the delay elements of said delay circuit and selectively adjusting the delay times of the respective delay elements of said reference delay generator and said delay circuit; and
each of said latch circuits operating in synchronism with a delayed intermediate signal obtained at one of said delay elements of said delay circuit.

22. An electronic device as claimed in claim 21, wherein:
an ith latch circuit among said latch circuits receives the delayed intermediate signal obtained at a jth delay element among said delay elements of said delay circuit; and
an (i+1)th latch circuit subsequent to said ith latch circuit receives the delayed intermediate signal obtained at a (j+1)th delay element subsequent to said jth delay element.

23. An electronic device as claimed in claim 21, wherein:
an ith latch circuit among said latch circuits receives the delayed intermediate signal obtained at a jth delay element among said delay elements of said delay circuit; and
an (i+1)th latch circuit subsequent to said ith latch circuit receives the delayed intermediate signal obtained at a (j−1)th delay element followed by said jth delay element.

24. An electronic device comprising:
a reference delay generator;
an internal circuit receiving an external signal and comprising M delay units where M is an integer greater than 1, a first delay unit having a corresponding delay element and the second and successively higher numbered delay units respectively having two and successively higher numbers of cascaded delay units, such that an ith delay unit (i=2, ..., M) has i delay elements which are cascaded; and
select means, coupled to said internal circuit, for selecting one of said M delay units in accordance with a select signal generated by an external device,
said reference delay generator comprising:
a delay unit having a plurality of delay elements which are cascaded and respectively have variable delay times, said delay unit receiving a reference signal and generating a delayed signal; and
control means, coupled to said delay unit and said internal circuit, for detecting a phase difference between said reference signal and said delayed signal and for generating a control signal which sets the phase difference to an integer multiple of 90°, said control signal being applied to said respective delay elements of said M delay units of said internal circuit and of said delay unit and selectively adjusting the delay times of said delay elements.

25. An electronic device as claimed in claim 24, further comprising dummy delay means for delaying said external signal by a delay time equal to that of said select means.

26. An electronic device comprising:
a reference delay generator;
an internal circuit receiving an input signal and generating an output signal having a delay, said internal circuit comprising a plurality of internal gates which are cascaded; and
variable power source means, coupled to said reference delay generator and said internal circuit, for generating a power source voltage having a selectively variable level based on a control signal, said variable level power source voltage being applied to said internal gates of said internal circuit,
said reference delay generator comprising:
a delay unit having a plurality of internal gates which are cascaded and respectively have selectively variable delay times, said delay unit receiving a reference signal and generating a delayed signal; and
control means, coupled to said delay unit and said internal circuit, for detecting a phase difference between said reference signal and said delayed signal and for generating said control signal which sets the phase difference to an integer multiple of 90°, said control signal being applied to said variable power source means to select the level of the power source voltage, the selectively variable delay times of the internal gates of said reference delay generator and said internal circuit being set to a selected value in accordance with the selected level of said variable power source voltage, based on said control signal.

27. An electronic device comprising:
a first chip having a first reference delay generator, a first delay circuit receiving an input signal and generating a first output signal which is a delayed version of said input signal, and a first input/output buffer operating in synchronism with said first output signal, said delay circuit comprising a plurality of delay elements which are cascaded and respectively have variable delay times;

a second chip having a second reference delay generator, a second delay circuit receiving said input signal and generating a second output signal which is a delayed version of said input signal, and a second input/output buffer operating in synchronism with said second output signal, said second delay circuit comprising a plurality of delay elements which are cascaded and respectively have variable delay times; and signal lines mutually connecting said input/output buffer and said input/output buffer, each of said first and second reference delay generators comprising:

a delay unit having a plurality of delay elements which are cascaded and respectively have selectively variable delay times, said delay unit receiving a reference signal and generating a delayed signal; and control means, coupled to said delay unit, for detecting a phase difference between said reference signal and said delayed signal and for generating a control signal which sets the phase difference to an integer multiple of 90°, said control signal being applied to the delay elements of said delay unit and a corresponding one of said first and second delay circuits, so that delay times of said first and second input/output buffers and signal lines are cancelled.

* * * * *

UNITED STATES PATENT AND TRADEMARK OFFICE
CERTIFICATE OF CORRECTION

PATENT NO. : 5,216,302
DATED : June 1, 1993
INVENTOR(S) : Tetsu TANIZAWA

It is certified that error appears in the above-indentified patent and that said Letters Patent is hereby corrected as shown below:

Col. 3,   line 12, delete "of".

Col. 4,   line 14, change "(" to --τ--.

Col. 8,   line 51, delete "of".

Col. 9,   line 62, after "edge" insert --of--.

Col. 13,  line 32, change "for control" to --the control--.

Signed and Sealed this

Twenty-first Day of June, 1994

Attest:

BRUCE LEHMAN

*Attesting Officer*    *Commissioner of Patents and Trademarks*